United States Patent
Kim et al.

(10) Patent No.: US 10,068,824 B2
(45) Date of Patent: Sep. 4, 2018

(54) ELECTRONIC COMPONENT PACKAGE HAVING ELECTRONIC COMPONENT WITHIN A FRAME ON A REDISTRIBUTION LAYER

(71) Applicant: SAMSUNG ELECTRO-MECHANICS CO., LTD., Suwon-si (KR)

(72) Inventors: Thomas A Kim, Suwon-si (KR); Kyu Bum Han, Suwon-si (KR); Chang Moo Jung, Suwon-si (KR); Kyung In Kang, Suwon-si (KR); Sang Kyu Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/264,684

(22) Filed: Sep. 14, 2016

(65) Prior Publication Data

US 2017/0263522 A1    Sep. 14, 2017

(30) Foreign Application Priority Data

Mar. 10, 2016  (KR) ........................ 10-2016-0028928

(51) Int. Cl.
*H01L 23/31* (2006.01)
*H01L 23/367* (2006.01)
(Continued)

(52) U.S. Cl.
CPC .......... *H01L 23/3171* (2013.01); *H01L 21/56* (2013.01); *H01L 23/367* (2013.01); *H01L 24/03* (2013.01); *H01L 24/09* (2013.01); *H01L 24/19* (2013.01); *H01L 24/33* (2013.01); *H01L 24/46* (2013.01); *H01L 24/49* (2013.01); *H01L 24/73* (2013.01); *H01L 2224/0231* (2013.01); *H01L 2224/0237* (2013.01); *H01L 2924/0105* (2013.01); *H01L 2924/01013* (2013.01); *H01L 2924/01022* (2013.01); *H01L 2924/01028* (2013.01); *H01L 2924/01029* (2013.01); *H01L 2924/01047* (2013.01);
(Continued)

(58) Field of Classification Search
CPC ..... H01L 23/3171; H01L 24/73; H01L 24/46; H01L 24/19; H01L 2224/0237
See application file for complete search history.

(56) References Cited

U.S. PATENT DOCUMENTS 7,528,482 B2    5/2009   Huang et al.
8,941,230 B2    1/2015   Kyozuka et al.
(Continued)

*Primary Examiner* — Michael Jung
(74) *Attorney, Agent, or Firm* — NSIP Law

(57) ABSTRACT

An electronic component package includes a frame, an electronic component, an encapsulant, a metal layer, and a redistribution layer. The frame has a through hole. The electronic component is disposed in the through hole of the frame and has an active surface on which electrode pads are formed and an inactive surface opposing the active surface. The encapsulant covers the inactive surface of the electronic component and is disposed between the frame and the electronic component within the through hole. The metal layer is formed on a surface of the encapsulant. The redistribution layer is disposed adjacently to the active surface of the electronic component and electrically connected to the electrode pads.

14 Claims, 8 Drawing Sheets

(51) Int. Cl.
*H01L 23/00* (2006.01)
*H01L 21/56* (2006.01)

(52) U.S. Cl.
CPC ............... *H01L 2924/01082* (2013.01); *H01L 2924/1434* (2013.01); *H01L 2924/1816* (2013.01)

(56) References Cited

U.S. PATENT DOCUMENTS

| | | | |
|---|---|---|---|
| 2010/0242272 A1* | 9/2010 | Kim | H01L 24/19 29/832 |
| 2012/0037935 A1* | 2/2012 | Yang | H01L 31/0203 257/98 |
| 2014/0186651 A1* | 7/2014 | Han | H05K 3/385 428/612 |
| 2015/0145142 A1* | 5/2015 | Lin | H01L 25/50 257/774 |
| 2015/0194388 A1* | 7/2015 | Pabst | H01L 23/552 257/659 |
| 2015/0255427 A1* | 9/2015 | Sung | H01L 25/0652 257/737 |
| 2015/0262983 A1 | 9/2015 | Krabe et al. | |
| 2017/0033062 A1* | 2/2017 | Liu | H01L 23/66 |

* cited by examiner

ELECTRONIC COMPONENT PACKAGE HAVING ELECTRONIC COMPONENT WITHIN A FRAME ON A REDISTRIBUTION LAYER

CROSS-REFERENCE TO RELATED APPLICATIONS

This application claims benefit under 35 USC 119(a) of Korean Patent Application No. 10-2016-0028928 filed on Mar. 10, 2016 in the Korean Intellectual Property Office, the entire disclosure of which is incorporated herein by reference for all purposes.

BACKGROUND

Field

The following description relates to an electronic component package and a method of manufacturing the same.

Description of Related Art

An electronic component package is defined as package technology for electrically connecting an electronic component to a printed circuit board (PCB), such as a main board of an electronic device, or the like, and protecting the electronic component from external impacts. Meanwhile, a recent trend in the development of technology related to electronic components is to reduce the size of the electronic components. As such, in the package field, and in accordance with a rapid increase in demand for miniaturized electronic components, or the like, the implementation of an electronic component package having a compact size and including a plurality of pins has been demanded.

One type of package technology suggested in order to satisfy the technical demand, as described above, is a wafer level package (WLP) using a redistribution wiring of an electrode pad of an electronic component formed on a wafer. An example of the wafer level package includes a fan-in wafer level package and a fan-out wafer level package. The fan-out wafer level package has a compact size and is advantageous in implementing a plurality of pins. Therefore, recently, the fan-out wafer level package has been actively developed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general configuration, an electronic component package includes a frame, an electronic component, an encapsulant, a metal layer, and a redistribution layer. The frame has a through hole. The electronic component is disposed in the through hole of the frame and has an active surface on which electrode pads are formed and an inactive surface opposing the active surface. The encapsulant covers the inactive surface of the electronic component and is disposed between the frame and the electronic component within the through hole. The metal layer is formed on a surface of the encapsulant. The redistribution layer is disposed adjacently to the active surface of the electronic component and electrically connected to the electrode pads.

The frame may include a first wiring layer formed on a surface of the frame. A second wiring layer may be formed on an inner wall of the frame. The metal layer may directly contact at least a portion of the first wiring layer and at least a portion of the second wiring layer.

The metal layer and the first and second wiring layers contacting the metal layer may serve as a ground (GND) of the electronic component package.

The surface of the first wiring layer may be coplanar with a surface of the encapsulant.

The frame may further include a through-wiring penetrating through the frame, and a third wiring layer formed on the other surface of the frame.

The electronic component package may further include a passivation layer disposed on the metal layer and having openings, and a heat sink disposed on the passivation layer and connected to the metal layer through the openings.

The electronic component package may further include a passivation layer disposed on the metal layer and having openings, and a memory chip package disposed on the passivation layer and connected to the metal layer through connection terminals formed in the openings. The connection terminals connected to the metal layer may be connection terminals for connecting a ground of the electronic component to a ground of the memory chip.

The memory chip package may include a substrate. The memory chip may be disposed on the substrate. A wire may be electrically connecting the substrate and the memory chip to each other. A second encapsulant may encapsulate the memory chip.

The electronic component package may further include a second passivation layer disposed on the redistribution layer and having second openings, and second connection terminals formed in the second openings. At least one of the second connection terminals may be disposed in a fan-out region.

The electronic component package may further include a second passivation layer disposed on the redistribution layer and having second openings, and second connection terminals formed in the second openings. At least one of the second connection terminals may be disposed in a fan-out region.

The electronic component package may further include a passivation layer disposed on the metal layer and having openings, and connection terminals formed in the openings. At least one of the connection terminals may be disposed in a fan-out region, and a connection terminal connected to the metal layer may be a connection terminal for connecting the electronic component to a ground.

The electronic component package may further include a second passivation layer disposed on the redistribution layer, a surface mounting component disposed on the second passivation layer and electrically connected to the electrode pads of the electronic component through the redistribution layer, and a second encapsulant disposed on the second passivation layer and encapsulating the surface mounting component.

In another general aspect, a method of manufacturing an electronic component package includes preparing a frame having a through hole; disposing an electronic component in the through hole, the electronic component having an active surface on which electrode pads are formed and an inactive surface opposing the active surface; forming an encapsulant covering the inactive surface of the electronic component and disposed between the frame and the electronic component within the through hole; grinding a surface of the encapsulant; forming a metal layer on the ground surface of the encapsulant, the metal layer facing the inactive surface of the electronic component with the encapsulant interposed therebetween; and forming a redistribution layer adjacently to the active surface of the electronic component, the redistribution layer being electrically connected to the electrode pads.

The method may further include, before the disposing of the electronic component: forming a first wiring layer on a surface of the frame; and forming a second wiring layer on an inner wall of the frame. The metal layer may directly contact at least a portion of the first wiring layer and at least a portion of the second wiring layer.

During grinding, a surface of the first wiring layer may be exposed.

The method may further include, before the disposing of the electronic component: forming a through-wiring penetrating through the frame; and forming a third wiring layer on the other surface of the frame.

In another general aspect, an electronic component package, includes: a frame, an electronic component, an encapsulant, a metal layer, and electrode pads. The frame has a through hole. The electronic component has a first surface and an opposing second surface. The electronic component is disposed in the through hole and spaced apart from sidewalls of the through hole. The encapsulant is disposed over the first surface of the electronic component and into the gap between sidewalls of the through hole and the electronic component. The metal layer is disposed over a planar surface of the encapsulant to electrically connect with ground terminals. Electrode pads electrically connected to a redistribution layer is disposed on the opposing second surface of the electronic component.

The first surface of the electronic component may be an inactive surface and the opposing second surface the active surface.

The frame may be used to structurally support the electronic component package.

An electronic device may include the electronic component package

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
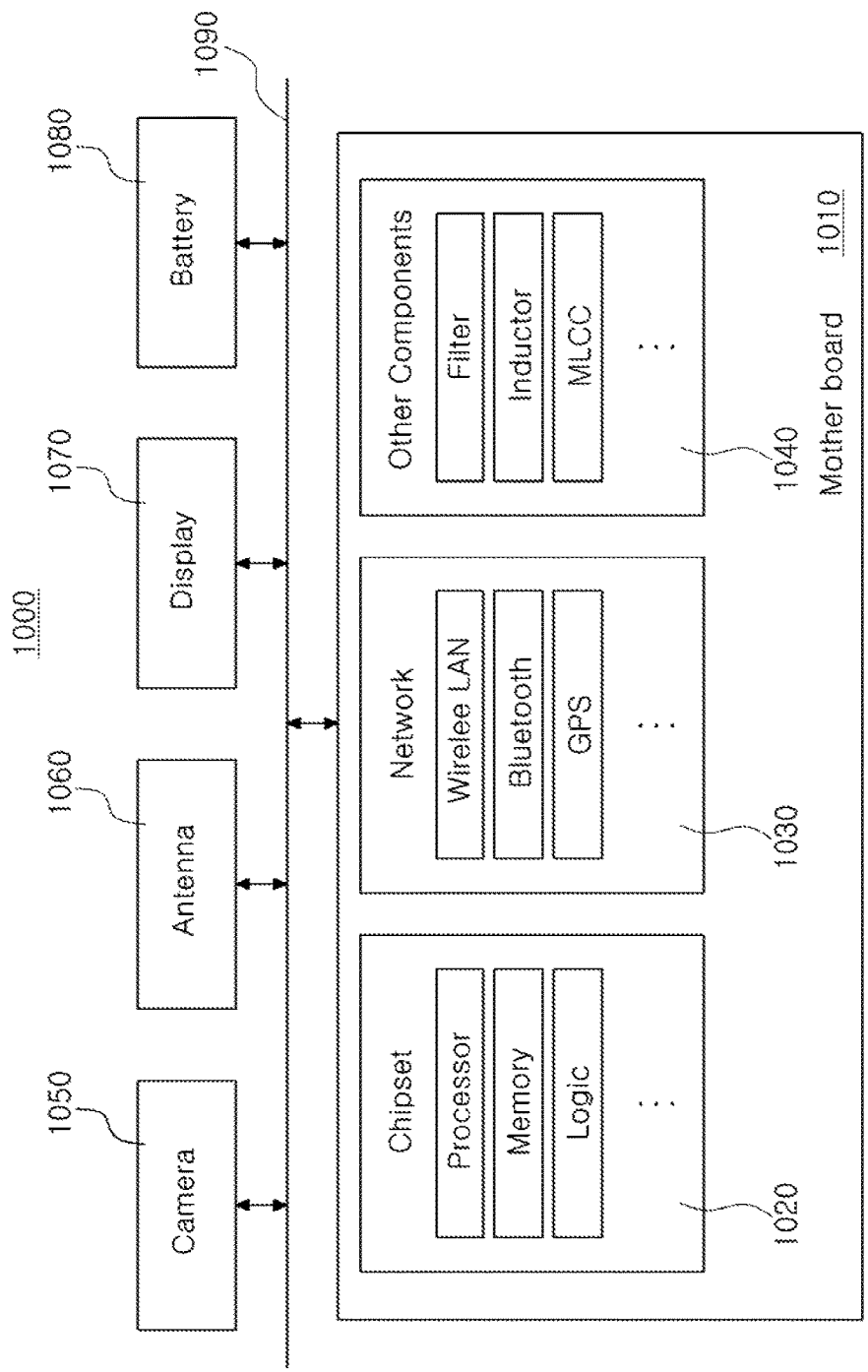
FIG. 1 is a block diagram schematically illustrating an example of an electronic device system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent to one of ordinary skill in the art. Further, although the examples described herein have a variety of configurations, other configurations are possible as will be apparent to one of ordinary skill in the art.

Electronic Device

FIG. 1 is a block diagram schematically illustrating an example of an electronic device system.

Referring to FIG. 1, an electronic device 1000 may accommodate a main board 1010 therein. Chip related components 1020, network related components 1030, other components 1040, and the like, may be physically and/or electrically connected to the main board 1010. These components may be connected to other components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphic processing unit (GPU)), a digital signal processor, a cryptographic processor, a microprocessor, a micro controller, or the like; a logic chip such as an analog-to-digital converter, an application-specific integrated circuit (ASIC), and the like. However, the chip related components 1020 are not limited thereto, and may also include other types of chip related components. In addition, different chip related components 1020 may be combined with each other.

The network related components 1030 may include protocols such as wireless fidelity (Wi-Fi) (Institute of Electrical and Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols and any other wireless and wired protocols designated after the above-mentioned protocols. However, the network related components 1030 are not limited thereto, and may also include any of a plurality of other wireless or wired standards or protocols. In addition, the different network related components 1030 may be combined with each other together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, these other components 1040 may be combined with each other together or with the chip related components 1020 and/or the network related components 1030 described above.

The electronic device 1000 may include other kinds of components that are or are not physically and/or electrically connected to the main board 1010. These other components may include, for example, a camera module 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage (for example, a hard disk drive) (not illustrated), a compact disk (CD) (not illustrated), a digital versatile disk (DVD) (not illustrated), and the like. However, these other components are not limited thereto, and may also include other components used for various purposes depending on a type of electronic device 1000.

The electronic device 1000 may be a smartphone, a personal digital assistant, a digital video camera, a digital still camera, a network system, a computer, a monitor, a tablet, a laptop, a netbook, a television, a video game console, a smartwatch, or the like. However, the electronic device 1000 is not limited thereto, and may also be any other electronic device processing data.

Figure 2:
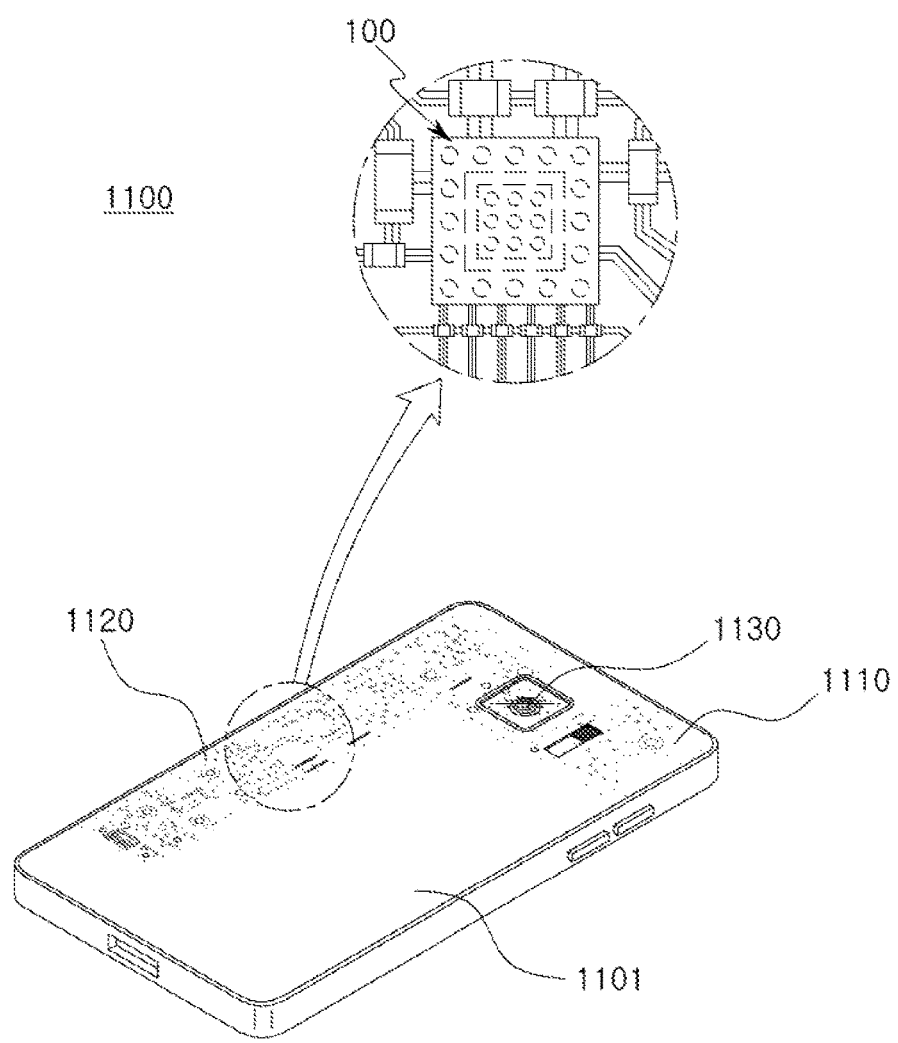
FIG. 2 is a view schematically illustrating an example of an electronic component package used in an electronic device.

FIG. 2 is a view schematically illustrating an example of an electronic component package used in an electronic device.

The electronic component package may be used for various purposes in the various electronic devices 1000 as described above. For example, a main board 1110 may be accommodated in a body 1101 of a smartphone 1100, and various electronic components 1120 may be physically and/or electrically connected to the main board 1110. In addition, other components that may be physically and/or electrically connected to the main board 1110, such as a camera module 1130, may be accommodated in the body 1101. Here, some of the electronic components 1120 may be the chip related components as described above, and the electronic component package 100 may be, for example, an application processor among the chip related components, but is not limited thereto.

Electronic Component Package

Figure 3:
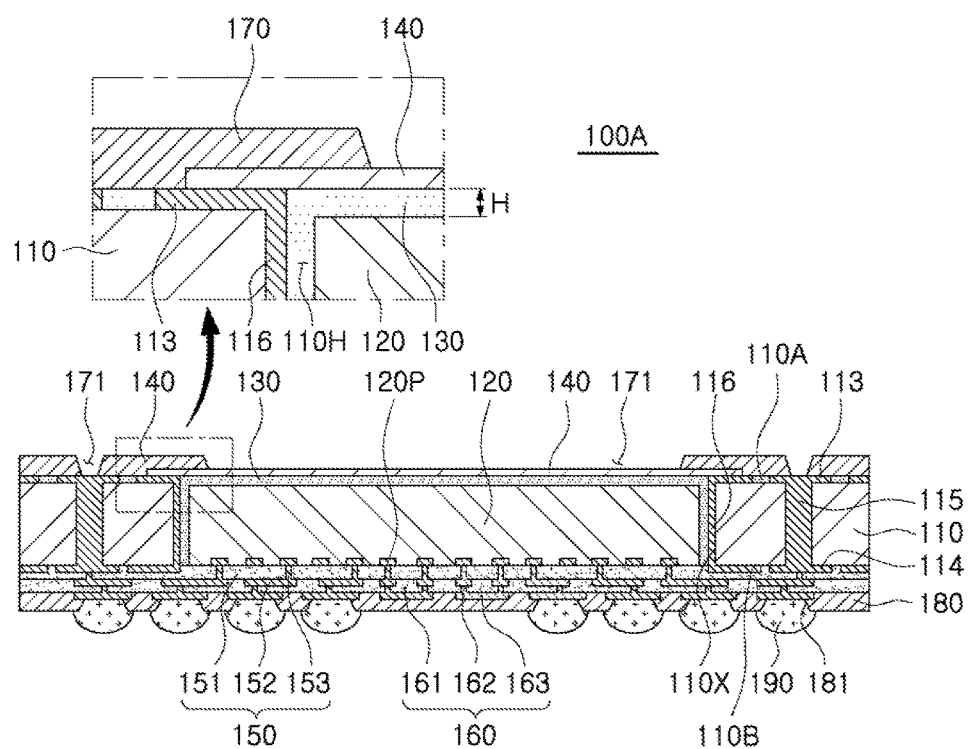
FIG. 3 is a cross-sectional view schematically illustrating an example of an electronic component package.

FIG. 3 is a cross-sectional view schematically illustrating an example of an electronic component package.

Referring to FIG. 3, an electronic component package 100A according to an example includes a frame 110 having a through hole 110H; an electronic component 120 disposed in the through hole 110H of the frame 110 and having an active surface on which electrode pads 120P are formed and an inactive surface opposing the active surface; an encapsulant 130 covering the inactive surface of the electronic component 120 and disposed between the frame 110 and the electronic component 120 within the through hole 110H; a metal layer 140 formed on a surface of the encapsulant 130 and facing the inactive surface of the electronic component 120 with the encapsulant 130 interposed therebetween; a first passivation layer 170 disposed on the metal layer 140 and having first openings 171; redistribution layers 150 and 160 disposed adjacently to the active surface of the electronic component 120 and electrically connected to the electrode pads 120P; a second passivation layer 180 disposed on the redistribution layers 150 and 160 and having second openings 181; and connection terminals 190 formed in the second openings 181.

Generally, an electronic component package has a structure in which the surrounding of an electronic component is simply molded and enclosed using an encapsulant such as an epoxy molding compound (EMC), or the like. In such a case, majority of the heat generated by the electronic component is discharged downwardly along redistribution layers, and only a very small amount of heat is conducted through the encapsulant due to its low thermal conductivity. However, when the metal layer 140 is introduced into a region encapsulating the electronic component 120, as described above, heat generated by the electronic component 120 is easily diffused, which improves the heat radiation characteristics.

In addition where the structure in which the electronic component is simply molded and enclosed using the encapsulant such as the EMC, operation characteristics of the electronic device in which the electronic component is mounted may deteriorate due to electromagnetic interference (EMI) caused by the electronic component or introduced from outside. But when the metal layer 140 is introduced into the region encapsulating the electronic component 120 as described above, the EMI is blocked.

In particular, as described below, the metal layer 140 may contact a portion of a first wiring layer 113 formed on an upper surface 110A of the frame 110 and a portion of a second wiring layer 116 formed on an inner wall 110X of the frame 110. Here, the portions of the first and second wiring layers 113 and 116 contacting the metal layer 140 may be ground patterns. In this case, the metal layer 140 is utilized as a ground (GND), which increases the design area in other regions within the electronic component package, thereby improving the degree of design freedom.

In addition, as described below, in a case in which the metal layer 140 directly contacts portions of the first and second wiring layers 113 and 116, grounds (GND) may be connected to each other without forming separate vias. Such a connection in the electronic component package increases efficiency and space utilization. In addition, a distance "H" between the metal layer 140 and the inactive surface of the electronic component 120 may be reduced, thereby improving the heat radiation efficiency.

Hereinafter, respective components of the electronic component package 100A according to an example will be described in more detail.

The purpose of the frame 110 may be to support the electronic component package 100A. Rigidity of the electronic component package 100A may be maintained and uniformity of a thickness of the electronic component package 100A may be secured by the frame. The frame 110 has an upper surface 110A and a lower surface 110B opposing the upper surface 110A. Here, the through hole 110H is formed through the upper surface 110A and the lower surface 110B. The electronic component 120 is disposed in the through hole 110H so as to be spaced apart from the frame 110 by a predetermined distance. As a result, the surroundings of side surfaces of the electronic component 120 may be enclosed by the frame 110.

The material of the frame 110 is not particularly limited as long as the frame can support the electronic component package. For example, an insulating material may be used as a material of the frame 110. Here, the insulating material may be a thermosetting resin such as an epoxy resin, a thermoplastic resin such as a polyimide resin, a resin having a reinforcing material such as a glass fiber or an inorganic filler impregnated in the thermosetting resin and the thermoplastic resin, such as pre-preg, Ajinomoto Build up Film (ABF), FR-4, Bismaleimide Triazine (BT), copper clad laminate (CCL), or the like. Alternatively, a metal having excellent rigidity and thermal conductivity may be used as the material of the frame 110. The metal may be an Fe—Ni based alloy. A Cu plating layer may be formed on a surface of the Fe—Ni based alloy in order to improve adhesion between the Fe—Ni based alloy and the molding material, the interlayer insulating material, or the like. In addition to the materials as described above, glass, ceramic, plastic, or the like, may also be used as a material of the frame 110.

A thickness of the frame 110 in a cross section thereof is not particularly limited, and may be designed depending on the thickness of the cross section of the electronic component 120. For example, the thickness of the frame 110 may be about 100 μm to 500 μm depending on a type of electronic component 120. The frame 110 may include one or multiple layers. In a case where the frame 110 includes a plurality of layers, wiring layers may be disposed between the plurality of layers. The thicknesses of respective layers are not particularly limited, and an overall thickness of the respective layers may be adjusted as described above.

The frame 110 includes the first wiring layer 113 formed on the upper surface 110A thereof, the second wiring layer 116 formed on the inner wall 110X thereof, a third wiring layer 114 formed on the lower surface 110B thereof, and through-wirings 115 penetrating through the frame 110.

The first wiring layer 113 may serve as a redistribution pattern, and conductive materials such as copper (Cu), aluminum (Al), silver (Ag), tin (Sn), gold (Au), nickel (Ni), lead (Pd), titanium (Ti), and/or alloys thereof, may be used as a material of the first wiring layer 113. The first wiring layer 113 may perform various functions depending on the design of the corresponding layer. For example, the first wiring layer 113 may serve as a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the first wiring layer 113 may also serve as via pads, connection terminal pads, or the like. A thickness of the first wiring layer 113 is not particularly limited, and may be, for example, about 10 μm to 50 μm.

The second wiring layer 116 may basically disperse heat generated by the electronic component 120 so as to be diffused toward the frame 110, and block electromagnetic waves. The second wiring layer 116 may also perform various functions depending on a design thereof, and may serve as a ground (GND) pattern. The second wiring layer 116 is disposed on the inner wall 110X of the frame 110. Therefore, the second wiring layer 116 encloses the surrounding side surfaces of the electronic component 120. The second wiring layer 116 may be formed to completely cover the inner wall 110X of the frame 110. Copper (Cu), aluminum (Al), silver (Ag), tin (Sn), gold (Au), nickel (Ni), lead (Pd), titanium (Ti), or alloys thereof, may be used as a material of the second wiring layer 116.

The third wiring layer 114 may serve as a redistribution pattern, and a conductive material such as copper (Cu), aluminum (Al), silver (Ag), tin (Sn), gold (Au), nickel (Ni), lead (Pd), titanium (Ti), or alloys thereof, may be used. The third wiring layer 114 may also perform various functions depending on the design of the corresponding layer. For example, the third wiring layer 114 may serve as a ground (GND) pattern, a power (PWR) pattern, a signal (S) pattern, and the like. The signal (S) pattern may include various signals except for the ground (GND) pattern, the power (PWR) pattern, and the like, such as data signals, and the like. In addition, the third wiring layer 114 may also serve as via pads, connection terminal pads, or the like. A thickness of the third wiring layer 114 is also not particularly limited, and may be, for example, about 10 µm to 50 µm.

The through-wirings 115 may pass through the frame 110, and serve to electrically connect redistribution patterns, disposed on different layers relative to the frame 110, to each other. Conductive materials such as copper (Cu), aluminum (Al), silver (Ag), tin (Sn), gold (Au), nickel (Ni), lead (Pd), titanium (Ti), and/or alloys thereof, may be used for the through-wiring 115. Upper and lower sides of the electronic component 120 may be electrically connected to each other through left and right side surfaces of the electronic component 120 via the through-wirings 115. This results in significant improvement in space utilization. In addition, the electronic component package may be applied to a package-on-package (PoP), a system-in-package (SiP), or the like, through a three-dimensional structure connection, such that the electronic component package may be applied to various modules, product groups, or the like.

The number, interval, and disposition form of through-wirings 115 are not particularly limited, and may be sufficiently modified depending on design particulars of those skilled in the art. The through-wirings 115 is connected to pad patterns of the first and third wiring layers 113 and 114. For example, the through-wirings 115 may be disposed over the entire region of the frame 110 depending on the form of other packages mounted on the electronic component package 110A. Alternatively, the through-wirings 115 may only be disposed in a specific region of the frame 110.

In a case in which a metal, such as Fe—Ni based alloy, is used as a material of the frame 110, an insulating material may be disposed between the metal and the through-wirings 115 in order to electrically insulate the metal and the through-wirings 115 from each other. A shape of the cross section of the through-wiring 115 is not particularly limited, and may be a known shape such as a tapered shape, a hourglass shape, a pillar shape, or the like. The through-wiring 115 may be completely filled with a conductive material, as illustrated in FIG. 3. However, the through-wiring 115 is not limited thereto, and may also be formed by forming a conductive material along a wall of a via.

The electronic component 120 may be an integrated circuit (IC) having hundreds to millions of integrated elements. The electronic component 120 may be an electronic component in which an integrated circuit is packaged in a flip-chip form. The integrated circuit may be an application processor chip such as a central processor (such as a CPU), a graphics processor (such as a GPU), a digital signal processor, a cryptographic processor, a microprocessor, a micro controller, or the like, but is not limited thereto.

The electrode component 120 includes the electrode pads 120P formed for the purpose of making an electrical connection. The purpose of the electronic pad 120P is to electrically externally connect the electronic component 120 and the material of the electrode pad 120P. The conductive material may be copper (Cu), aluminum (Al), silver (Ag), tin (Sn), gold (Au), nickel (Ni), lead (Pd), titanium (Ti), or alloys thereof, but is not limited thereto. The electrode pad 120P may have an embedded form or a protruding form. The surface on which the electrode pads 120P are formed is an active surface, and the opposite surface is an inactive surface.

In a case in which the electronic component 120 is the integrated circuit, the electronic component 120 may have a body (not denoted by a reference number), a passivation layer (not denoted by a reference number), and the electrode pads 120P. The body may be formed on the basis of, for example, an active wafer. In this case, silicon (Si), germanium (Ge), gallium arsenide (GaAs), or the like, may be used as a basic material of the body. The passivation layer may serve to protect the body from external factors, and may be formed of, for example, an oxide layer, a nitride layer, a double layer of an oxide layer and/or a nitride layer. A conductive material such as copper (Cu), aluminum (Al), silver (Ag), tin (Sn), gold (Au), nickel (Ni), lead (Pd), titanium (Ti), or alloys thereof may be used as a material of the electrode pad 120P, as described above.

A thickness of the electronic component 120 in a cross section thereof is not particularly limited, and may be changed depending on a type of electronic component 120. For example, in the case in which the electronic component is the integrated circuit, a thickness of the electronic component may be about 100 µm to 480 µm, but is not limited thereto. An upper surface of the electronic component 120 is at a level below the upper surface 110A of the frame 110. The height difference between the upper surface of the electronic component 120 and the upper surface 110A of the frame 110 may be 2 µm or more, for example, 5 µm. The height difference prevents the generation of cracks in corners of the upper surface of the electronic component 120. In addition, a deviation from an intended insulating distance, i.e., height difference between the upper surface of the electronic component 120 and the upper surface 110A of the frame 110, may be significantly reduced.

The purpose of the encapsulant 130 is to protect the electronic component 120. The form of the encapsulant 130 is not particularly limited, and may be a form enclosing portions of the electronic component 120. As an example, the encapsulant 130 may cover the frame 110 and the electronic component 120, and be filled in a space between of the frame 110 and the electronic component 120 within the through hole 110H. Therefore, the encapsulant 130 may serve to reduce buckling of the electronic component 120 while serving as an adhesive, depending on the properties material of the encapsulant 130.

The properties of the encapsulant 130 is not particularly limited. For example, an insulating material may be used as a material of the encapsulant 130. Here, the insulating material may be a thermosetting resin such as an epoxy resin, a thermoplastic resin such as a polyimide resin, a resin having a reinforcing material such as an organic or inorganic filler impregnated in the thermosetting resin and the thermoplastic resin, or the like. Alternatively, the insulating material may be an epoxy molding compound (EMC), or the like.

An upper surface of the encapsulant 130 may be coplanar with an upper surface of the first wiring layer 113. Here, the word 'coplanar' means that the upper surface of the encapsulant 130 and the upper surface of the first wiring layer 113 are substantially even with each other depending on the process used. That is, the surface of the encapsulant 130 may be planarized by grinding, or the like. In a case in which the metal layer 140 is formed on the upper surface of the encapsulant 130 and planarized by the grinding, the metal layer 140 may directly contact portions of the first wiring layer 113 and the second wiring layer 116 without vias resulting in the manufacture of a thin electronic component package. In addition, a distance "H" between the metal layer 140 and the inactive surface of the electronic component 120 may be reduced, such that heat radiation efficiency may be improved.

An interval of the space within the through hole 110X filled with the encapsulant 130 is not particularly limited, and may be optimized by those skilled in the art. For example, an interval of the space within the through hole 110X filled with the encapsulant 130 may be about 10 μm to 150 μm, but is not limited thereto.

The metal layer 140 disperses heat generated by the electronic component 120 towards the frame 110, and blocks electromagnetic waves, similar to the second wiring layer 116. In addition, the metal layer 140 may serve as a ground (GND) for signal patterns, and the like, formed in the electronic component package. In this case, the metal layer 140 may be directly connected to portions of the first wiring layer 113 and the second wiring layer 116 serving as the ground (GND), such that separate vias do not need to be formed. A distance "H" between the metal layer 140 and the inactive surface of the electronic component 120 is small, such that heat radiation efficiency is increased.

The metal layer 140 may be formed on the inactive surface of the electronic component 120 with the encapsulant 130 interposed therebetween. A conductive material such as copper (Cu), aluminum (Al), silver (Ag), tin (Sn), gold (Au), nickel (Ni), lead (Pd), titanium (Ti), or alloys thereof, may be used as a material of the metal layer 140. For example, the metal layer 140 may be formed by forming a plating layer containing copper (Cu) on a seed layer containing titanium (Ti) and copper (Cu), but is not limited thereto.

The first passivation layer 170 may serve to protect the first wiring layer 114, the metal layer 140, and the like, formed on the upper surface 110A of the frame 110. The first passivation layer 170 may be disposed on the metal layer 140 and the first wiring layer 114, and may have first openings 171 exposing portions of the metal layer 140 and the first wiring layer 114.

A detailed material of the first passivation layer 170 is not particularly limited. For example, an insulating material may be used as the material of the first passivation layer 170. Here, the insulating material may be a thermosetting resin such as an epoxy resin, a thermoplastic resin such as a polyimide resin, a resin having a reinforcing material such as an organic or inorganic filler impregnated in the thermosetting resin and the thermoplastic resin, or the like.

The purpose of the redistribution layers 150 and 160 is to redistribute the electrode pads 120P of the electronic component 120. Tens to hundreds of electrode pads 120P having various functions may be redistributed through the redistribution layers 150 and 160 and may be physically and/or electrically externally connected through the connection terminals 190. The redistribution layers 150 and 160 may include insulating layers 151 and 161, wiring layers 152 and 162 formed on the insulating layers 151 and 161, and vias 153 and 163 penetrating through the insulating layers 151 and 161, respectively. The redistribution layers 150 and 160 may be a single layer or be a plurality of layers.

An insulating material may be used as materials of the insulating layers 151 and 161. Particularly, in a case in which a photosensitive insulating material such as a photo imagable dielectric (PID) resin is used as materials of the insulating layers, the insulating layers 151 and 161 may be formed at a reduced thickness. Materials of the insulating layers 151 and 161 may be the same as each other, if necessary. Thicknesses of the insulating layers 151 and 161 are also not particularly limited. For example, thicknesses of the insulating layers 151 and 161 except for the wiring layers 152 and 162 may be about 5 μm to 20 μm, and thicknesses of the insulating layers 151 and 161 when considering thicknesses of the wiring layers 152 and 162 may be about 15 μm to 70 μm.

The wiring layers 152 and 162 may serve as redistribution patterns, and conductive materials such as copper (Cu), aluminum (Al), silver (Ag), tin (Sn), gold (Au), nickel (Ni), lead (Pd), titanium (Ti), and/or alloys thereof, may be used for the wiring layers 152 and 162. The wiring layers 152 and 162 may perform various functions depending on a design of the corresponding layers. For example, the wiring layers 152 and 162 may serve as a ground (GND) pattern, a power (PWR) pattern, a signal (S) pattern, and the like. In addition, the wiring layers 152 and 162 may also serve as via pads, connection terminal pads, or the like. Thicknesses of the wiring layers 152 and 162 are also not particularly limited, and may be, for example, about 10 μm to 50 μm.

A surface treatment layer may be further formed on exposed portions of the wiring layers 152 and 162, if necessary. The surface treatment layer is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like. This may also be applied to other wiring layers.

The vias 153 and 163 may electrically connect the wiring layers 152 and 162, the electrode pads 120P, and the like, formed on different layers to each other, thereby forming an electrical path within the electronic component package 100A. Conductive materials such as copper (Cu), aluminum (Al), silver (Ag), tin (Sn), gold (Au), nickel (Ni), lead (Pd), titanium (Ti), and/or alloys thereof, may be used as materials of the vias 153 and 163. The vias 153 and 163 may also be completely filled with a conductive material. Alternatively, a conductive material may be formed along walls of the vias. In addition, the vias 153 and 163 may have all of the cross section shapes known in the related art, such as a tapered shape, a cylindrical shape, or the like.

The purpose of the second passivation layer 180 may be to protect the redistribution layers 150 and 160 from external physical and chemical damage. The second passivation layer 180 has the second openings 181 exposing portions of the wiring layer 162 of the redistribution layers 150 and 160. Although the second openings 181 may expose portions of the wiring layer 162, the second openings 181 may also expose side surfaces of the wiring layer 162 in some cases.

A material of the second passivation layer 180 is not particularly limited. For example, a solder resist may be used as a material of the second passivation layer 180. In addition, the same material as that of the insulating layers 151 and 161 of the redistribution layers 150 and 160, for example, the same PID resin may also be used as a material of the second passivation layer 180. The second passivation layer 180 is generally a single layer, but may also be formed of multiple layers.

The purpose of the connection terminals 190 may be to physically and/or electrically externally connect the electronic component package 100A. For example, the electronic component package 100A may be mounted on the main board of the electronic device through the connection terminals 190. The connection terminals 190 may be disposed in the second openings 181, and be connected to the wiring layers 152 and 162 exposed through the second opening 181. Therefore, the connection terminals 190 may also be electrically connected to the electronic component 120.

The connection terminal 190 may be formed of a conductive material, such as copper (Cu), aluminum (Al), silver (Ag), tin (Sn), gold (Au), nickel (Ni), lead (Pd), solder, or the like, but is not particularly limited thereto. The connection terminal 190 may be a land, a ball, a pin, or the like. The connection terminal 190 may be formed of multiple layers or a single layer. In a case in which the connection terminal 190 is formed of multiple layers, the connection terminal 190 may contain a copper pillar and a solder, and in a case in which the connection terminal 190 is formed of a single layer, the connection terminal 190 may contain a tin-silver solder or copper. However, this is only an example, and the connection terminal 190 is not limited thereto.

At least one of the connection terminals 190 may be disposed in a fan-out region. The fan-out region is defined as a region except for a region in which the electronic component is disposed. That is, the electronic component package 100A according to an example may be a fan-out package. The fan-out package may have reliability greater than that of a fan-in package, may implement a plurality of I/O terminals, and may easily perform 3D interconnection. In addition, since the fan-out package may be mounted on the electronic device without using a separate substrate as compared to a ball grid array (BGA) package, a land grid array (LGA) package, or the like, the fan-out package may be manufactured at a reduced thickness, and may have a lower cost of manufacture.

The number, interval, and disposition form of connection terminals 190 are not particularly limited, and may be sufficiently modified depending on design particulars by those skilled in the art. For example, the number of connection terminals 190 may be several tens to several thousands, depending on the number of electrode pads 120P of the electronic component 120. The number of connection terminals 190 is not limited thereto, and may also be several tens to several thousands or more.

Figure 4A:
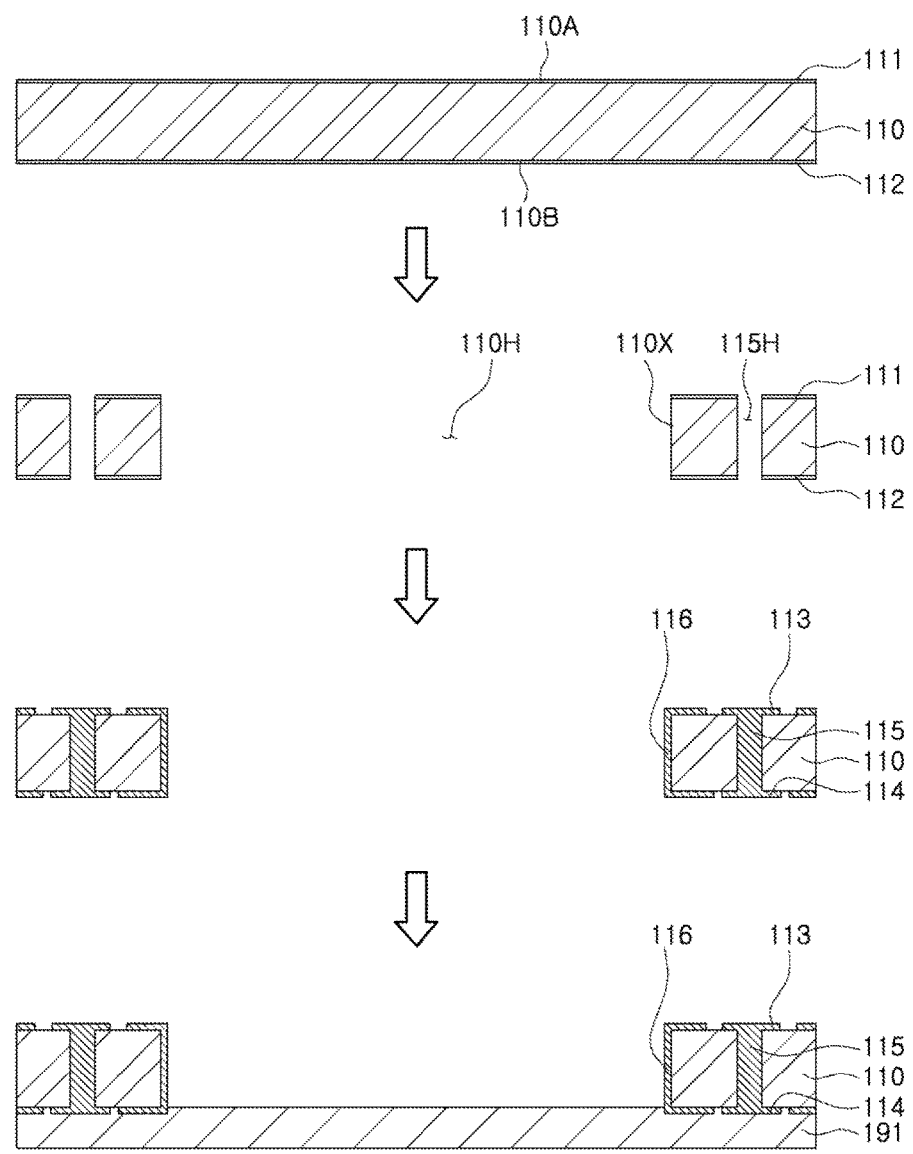
FIGS. 4A through 4C are schematic views illustrating examples of processes of manufacturing the electronic component package of FIG. 3.
Figure 4B:
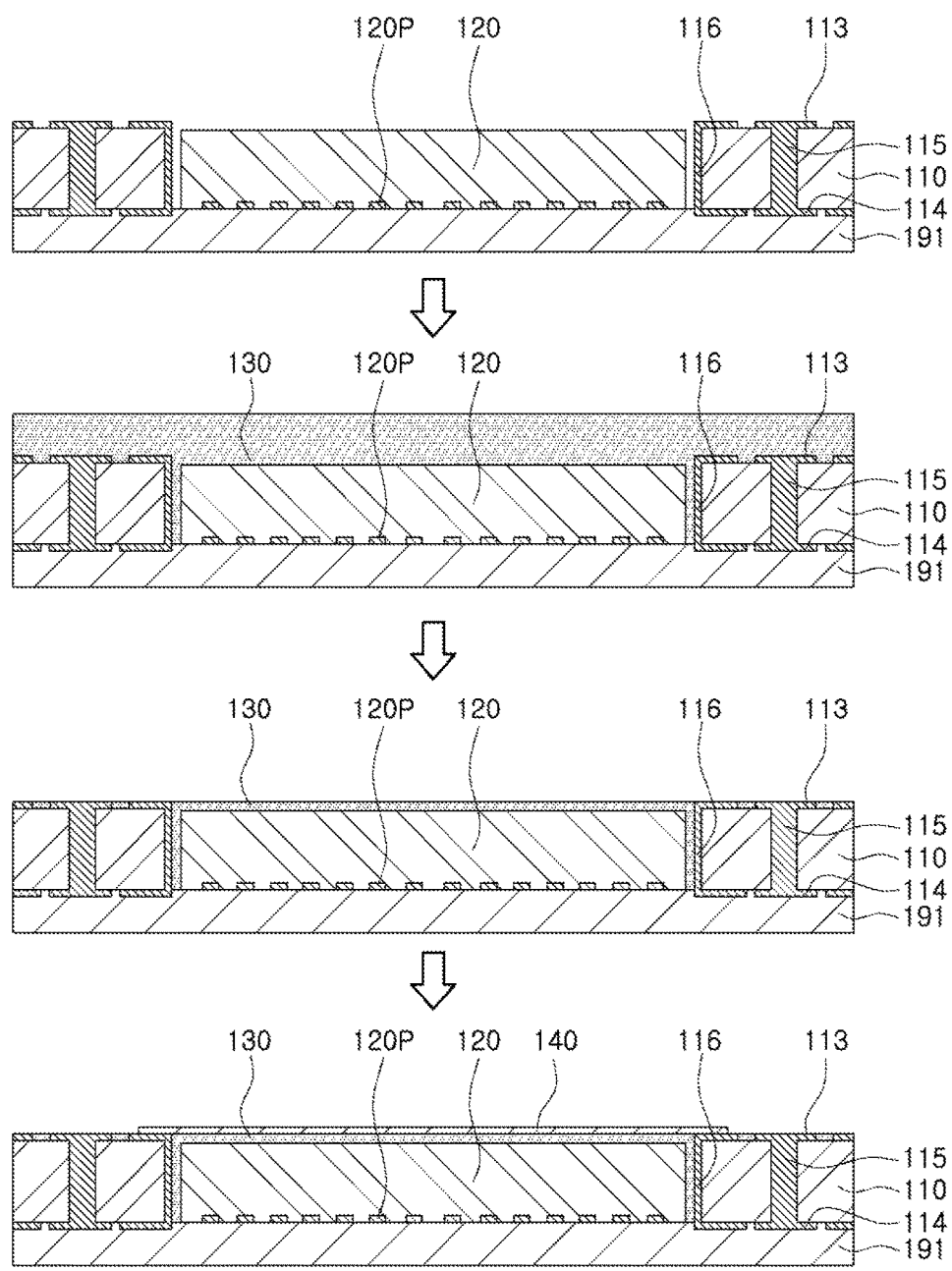
Figure 4C:
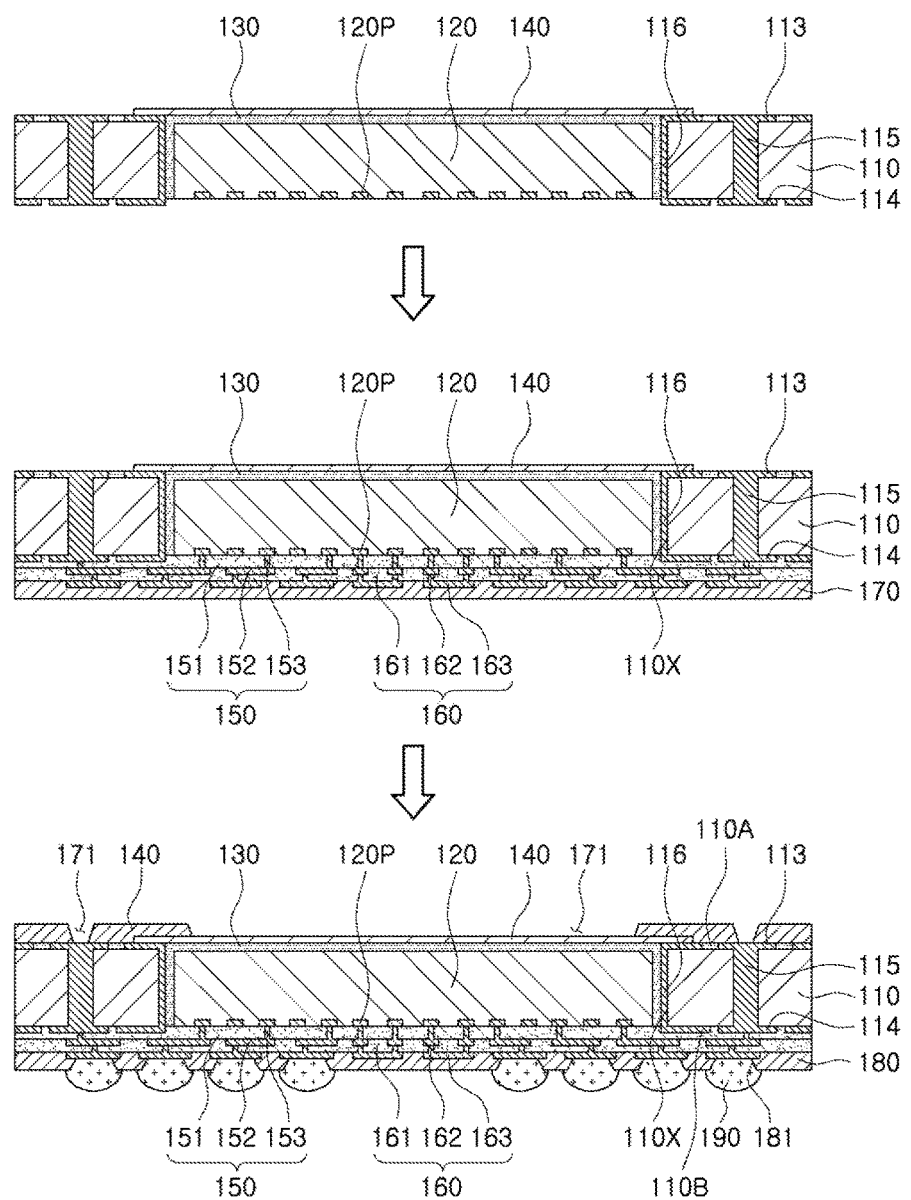

FIGS. 4A through 4C are schematic views illustrating examples of processes of manufacturing the electronic component package of FIG. 3.

In describing processes of manufacturing the electronic component package 100A according to an example, a description elements overlapped with elements described above will be omitted, and elements different from the elements described above will mainly be described.

FIG. 4A depicts the processes to prepare the frame 110. Metal layers 111 and 112 are formed on the upper surface 110A and the lower surface 110B of the frame 110, respectively. The frame 110 may be, for example, a copper clad laminate (CCL), but is not limited thereto. The metal layers 111 and 112 serve as seed layers in the subsequent process.

Next, through hole 110H and holes 115H for through-wirings that penetrate through the frame 110 are formed. The through hole 110H and the holes 115H for through-wirings may be formed using mechanical drilling and/or laser drilling. However, the through hole 110H and the holes 115H for through-wirings are not limited to being formed using mechanical drilling and/or laser drilling, and may also be formed by a sand blasting method using particles for polishing, a dry etching method using plasma, or the like. In a case in which the through hole 110H and the holes 115H for through-wirings are formed using mechanical drilling and/or laser drilling, a desmearing process such as a permanganate method, or the like, may be performed to remove resin smear in the through hole 110H and the holes 115H for through-wirings.

Next, a first wiring layer 113, a second wiring layer 116, a third wiring layer 114, and a through-wirings 115 are formed on the upper surface 110A, the inner wall 110X, the lower surface 110B, and the holes 115H for through-wirings of the frame 110, respectively. The first wiring layer 113, the second wiring layer 116, the third wiring layer 114, and the through-wirings 115 may be formed by electrolytic copper plating, electroless copper plating, or the like, using a dry film. In more detail, the first wiring layer 113, the second wiring layer 116, the third wiring layer 114, and the through-wirings 115 may be formed using a method such as chemical vapor deposition (CVD), physical vapor deposition (PVD), sputtering, a subtractive process, an additive process, a semi-additive process (SAP), a modified semi-additive process (MSAP), or the like, but are not limited thereto.

Next, an adhesive film 191 may be attached to the lower surface 110B of the frame 110. In this case, the third wiring layer 114 formed on the lower surface 110B of the frame 110 may be depressed into the adhesive film 191, but is not necessarily limited thereto. Any material that may fix the frame 110 may be used as the adhesive film 191. As a non-restrictive example of this material, a known tape may be used. An example of the known tape may include a thermosetting adhesive tape of which adhesion is weakened by heat treatment, an ultraviolet-curable adhesive tape of which adhesion is weakened by ultraviolet ray irradiation, or the like.

Next, referring to FIG. 4B, the electronic component 120 is attached to an adhesive film 191 in the through hole 110H of the frame 110 in face-down form. Here, face-down form refers to a form in which the active surface of the electronic component 120 is attached to the adhesive film 191.

Then, an encapsulant 130 covering the inactive surface of the electronic component 120 is disposed within the through hole 110H and between the frame 110 and the electronic component 120 through hole. The encapsulant 130 may be formed by laminating a precursor of the encapsulant 130 and then hardening the precursor. Alternatively, the encapsulant 130 may be formed by a method of applying a pre-encapsulant to the adhesive film 191 so as to encapsulate the electronic component 120 and then hardening the pre-encapsulant. The electronic component 120 may be fixed by the hardening. The precursor may be laminated, for example, by performing a hot press process of pressing the precursor for a predetermined time at a high temperature, decompressing the precursor, and then cooling the precursor to room temperature, cooling the precursor in a cold press process, and then separating a work tool. To apply the pre-encapsulant, for example, a screen printing method may be used by applying ink with a squeegee, and a spray printing method of applying ink in a mist form may be used.

Next, grinding may be performed on a surface of the encapsulant 130. An upper surface of the first wiring layer 113 may be exposed by the grinding. That is, the upper surface of the first wiring layer 113 and the upper surface of the encapsulant 130 may be coplanar with each other by the grinding. The grinding may be performed by a known method. In a case in which the metal layer 140 is formed by the grinding as described above, the metal layer 140 may directly contact a portion of the first wiring layer 113 and a portion of the second wiring layer 116. In addition, a distance "H" between the metal layer 140 and the inactive surface of the electronic component 120 is reduced. The disclosed processes simplify the manufacturing the electronic component package and results in a thinner electronic component package. This also improves heat radiation efficiency of the electronic component package.

Next, a metal layer 140 is disposed over the inactive surface of the electronic component 120 with the encapsulant 130 interposed therebetween. The metal layer 140 may be formed by a known plating process. For example, the metal layer 140 may be formed by sequentially forming a seed layer and a plating layer by the plating process as described above. However, the metal layer 140 is not limited to being formed as described above, and may also be formed by another known metallization method. In this case, the metal layer 140 may directly contact a portion of the first wiring layer 113 and a portion of the second wiring layer 116.

Next, in FIG. 4C, the adhesive film 191 is peeled off. A method of peeling the adhesive film 191 off is not particularly limited, and may be a known method. For example, the adhesive film 191 may be peeled off by weakening a thermosetting adhesive tape by applying heat treatment, and adhesion of an ultraviolet-curable adhesive tape may be weakened by ultraviolet ray irradiation. However, the method of peeling off the adhesive film 191 is not limited thereto.

Next, redistribution layers 150 and 160 electrically connected to the electrode pads 120P are formed on portions from which the adhesive film 191 is removed, that is, adjacently to the active surface of the electrode component 120. The redistribution layers 150 and 160 are formed by forming the insulating layer 151, forming the wiring layer 152 and the via 153 on and in the insulating layer 151, forming the insulating layer 161 on the insulating layer 151, and forming the wiring layer 162 and the via 163 on and in the insulating layer 161. The insulating layers 151 and 161 may be formed by a known method, for example, a method of laminating precursors of the insulating layers 151 and 161 and then hardening the precursors. The wiring layers 152 and 162, and the vias 153 and 163 may also be formed by a known method. Via holes (not illustrated) may be formed using mechanical drilling and/or laser drilling. Alternatively, the via holes may also be formed by a photolithography method in a case in which the insulating layers 151 and 161 contain a photosensitive material. The wiring layers 152 and 162, and the vias 153 and 163 may also be formed by electrolytic copper plating, electroless copper plating, or the like, using a dry film pattern.

Next, a first passivation layer 170 having first openings 171 is formed on the metal layer 140. The first openings 171 of the first passivation layer 170 may also expose portions of an upper surface of the first wiring layer 113, if necessary. In this case, although not illustrated in FIG. 4C, connection terminals, or the like, may also be formed on the exposed portions of the upper surface of the first wiring layer 113. The first passivation layer 170 may be formed by laminating a material such as a solder resist, or the like, and then hardening the material. The first openings 171 may be formed by a known photolithography method, or the like.

In addition, a second passivation layer 180 disposed on the redistribution layers 150 and 160 and having the second openings 181 is formed. The second openings 181 of the second passivation layer 180 expose portions of the wiring layer 162 of the redistribution layers 150 and 160. The connection terminals 190 are formed in the second openings 181. The second passivation layer 180 and the second openings 181 may be formed by the same method as a method of forming the first passivation layer 170 and the first openings 171. A method of forming the connection terminals 190 is not particularly limited. That is, the connection terminals 190 may be formed by a method well-known in the related art depending on a structure or a form of the connection terminals. The connection terminals 190 may be fixed by reflow, and portions of the connection terminals 190 are embedded in the second passivation layer 180 for a secure fix to increase reliability. In some cases, only the connection terminals 190 are formed by a separate process by a client purchasing the electronic component package 100A.

The series of processes are not necessarily limited to the sequence described above, and the sequence may also be varied by various methods. For example, the first and third wiring layers 113 and 114 may be formed before the through hole 110H and the holes 115H for through-wirings are formed, the through hole 110H and the holes 115H for through-wirings may be formed, and the second wiring layer 116 and the through-wirings 115 may be finally formed. In addition, the first passivation layer 170 and the first openings 171 may be formed before the redistribution layers 150 and 160 are formed. That is, a sequence of forming the components described above is not particularly limited to the sequence described above.

Figure 5:
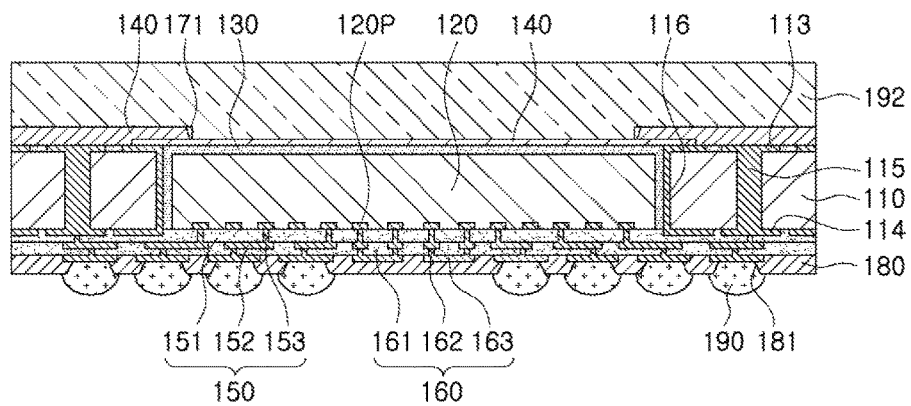
FIG. 5 is a cross-sectional view schematically illustrating another example of an electronic component package.

FIG. 5 is a cross-sectional view schematically illustrating another example of an electronic component package.

FIG. 5 depicts an electronic component package 100B according to another example. The electronic component package 100B includes a frame 110 having a through hole 110H; an electronic component 120 disposed in the through hole 110H of the frame 110 and having an active surface on which electrode pads 120P are formed and an inactive surface opposing the active surface; an encapsulant 130 covering the inactive surface of the electronic component 120 and disposed between the frame 110 and the electronic component 120 within the through hole 110H; a metal layer 140 formed on a surface of the encapsulant 130 and facing the inactive surface of the electronic component 120 with the encapsulant 130 interposed therebetween; a first passivation layer 170 disposed on the metal layer 140 and having first openings 171; redistribution layers 150 and 160 disposed adjacently to the active surface of the electronic component 120 and electrically connected to the electrode pads 120P; a second passivation layer 180 disposed on the redistribution layers 150 and 160 and having second openings 181; connection terminals 190 formed in the second openings 181; and a heat sink 192 disposed on the first passivation layer 170 and connected to the metal layer 140 through the first openings 171.

Hereinafter, respective components included in the electronic component package 100B according to another example will be described. Description for contents overlapped with the contents described above will be omitted, and contents different from the contents described above will be mainly described.

The purpose of the heat sink 192 is to effectively radiate heat generated by the electronic component 120. The heat sink 192 may be connected to the metal layer 140 to significantly improve a heat radiation effect. The material of the heat sink 192 is not particularly limited, and may be any material having sufficient thermal conductivity. For example, the heat sink may be formed of copper (Cu), aluminum (Al), another metal, or a non-metal having high thermal conductivity.

The process of manufacturing the electronic component package 100B is the same as the process of manufacturing the electronic component package 100A described above except that the heat sink 192 is further formed. Therefore, a description of the process of manufacturing the electronic component package 100B according to another example will be omitted.

Figure 6:
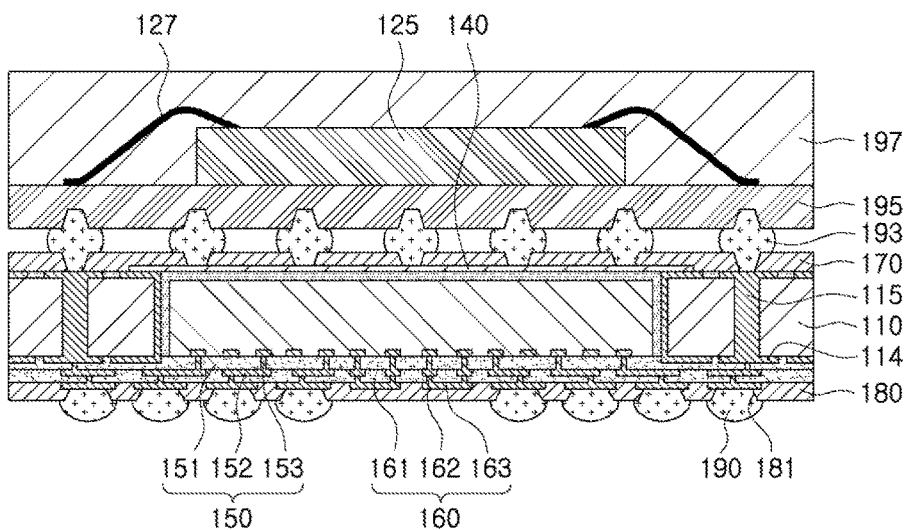
FIG. 6 is a cross-sectional view schematically illustrating another example of an electronic component package.

FIG. 6 is a cross-sectional view schematically illustrating another example of an electronic component package.

FIG. 6 depicts an electronic component package 100C according to another example. The electronic component package 100C includes a frame 110 having a through hole 110H; an electronic component 120 disposed in the through hole 110H of the frame 110 and having an active surface on which electrode pads 120P are formed and an inactive surface opposing the active surface; an encapsulant 130 covering the inactive surface of the electronic component 120 and disposed between the frame 110 and the electronic component 120 within the through hole 110H; a metal layer 140 formed on a surface of the encapsulant 130 and facing the inactive surface of the electronic component 120 with the encapsulant 130 interposed therebetween; a first passivation layer 170 disposed on the metal layer 140 and having first openings 171; first connection terminals 193 formed in the first openings 171; redistribution layers 150 and 160 disposed adjacently to the active surface of the electronic component 120 and electrically connected to the electrode pads 120P; a second passivation layer 180 disposed on the redistribution layers 150 and 160 and having second openings 181; second connection terminals 190 formed in the second openings 181; and a memory chip package disposed on the first passivation layer 170 and connected to the metal layer 140 through the first connection terminals 193 formed in the first openings 171.

Hereinafter, respective components included in the electronic component package 100C according to another example will be described. Descriptions of contents overlapped with the contents described above will be omitted, and contents different from the contents described above will mainly be described.

The memory chip package may include a substrate 195 having wiring layers (not illustrated) formed therein, a memory chip 125 disposed on the substrate 195, wires 127 electrically connecting the wiring layers of the substrate 195 and the memory chip 125 to each other, and a second encapsulant 197 encapsulating the memory chip 125. In this case, a ground line of the memory chip package may be connected to a ground line of the electronic component 120 through the first connection terminals 193 connected to the metal layer 140. That is, the metal layer 140 may serve as a ground of the memory chip package.

The substrate 195 may be a ball grid array (BGA) substrate, which may serve to redistribute the memory chip 125. The wire 127 may be formed of a conductive material and be utilized for wire bonding. The memory chip 125 may be a volatile memory (such as a dynamic random access memory (DRAM)), a non-volatile memory (such as a read only memory (ROM)), a flash memory, or the like, but is not limited thereto. The second encapsulant 197 may be an EMC.

A process of manufacturing the electronic component package 100C according to another example is the same as the process of manufacturing the electronic component package 100A described above except that the memory chip package is further formed on the electronic component package 100A. Therefore, a description for the process of manufacturing the electronic component package 100C according to another example will be omitted.

Figure 7:
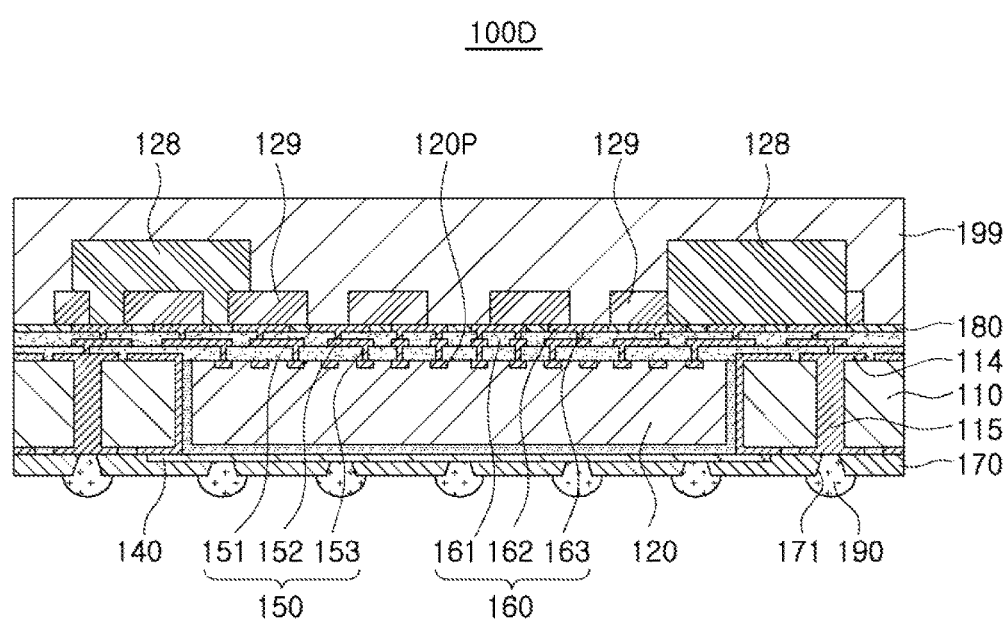
FIG. 7 is a cross-sectional view schematically illustrating another example of an electronic component package.

FIG. 7 is a cross-sectional view schematically illustrating another example of an electronic component package.

In FIG. 7, an electronic component package 100D according to another example includes a frame 110 having a through hole 110H; an electronic component 120 disposed in the through hole 110H of the frame 110 and having an active surface on which electrode pads 120P are formed and an inactive surface opposing the active surface; an encapsulant 130 covering the inactive surface of the electronic component 120 and disposed between the frame 110 and the electronic component 120 within the through hole 110H; a metal layer 140 formed on a surface of the encapsulant 130 and facing the inactive surface of the electronic component 120 with the encapsulant 130 interposed therebetween; a first passivation layer 170 disposed on the metal layer 140 and having first openings 171; connection terminals 190 formed in the first openings 171; redistribution layers 150 and 160 disposed adjacently to the active surface of the electronic component 120 and electrically connected to the electrode pads 120P; a second passivation layer 180 disposed on the redistribution layers 150 and 160; surface mounting components 128 and 129 disposed on the second passivation layer 180 and electrically connected to the electrode pads 120 of the electronic component 120 through the redistribution layers 150 and 160; and a second encapsulant 199 disposed on the second passivation layer 180 and encapsulating the surface mounting components 128 and 129.

Hereinafter, respective components included in the electronic component package 100D according to another example will be described. Description for contents overlapped with the contents described above will be omitted, and contents different from the contents described above will mainly be described.

In the electronic component package 100D, according to another example, the electronic component 120 is faced up in relation to a mounted surface. That is, the mounted surface connected to a board, or the like, may be formed adjacently to the inactive surface of the electronic component 120. In this case, portions of the metal layer 140 formed adjacently to the inactive surface is exposed by the openings 171 of the first passivation layer 170, and the exposed portions of the metal layer 140 may be connected to some of the connection terminals 190. The connection terminals 190 connected to the metal layer 140 may be utilized as connection terminals 190 for a connection to a ground.

In the electronic component package 100D, according to another example, several kinds of surface mounting components 128 and 129 are disposed adjacently to the active surface of the electronic component 120. The surface mounting components 128 and 129 may be various kinds of integrated circuits (ICs) or various kinds of passive components. The passive components may be a known capacitor, a filter, and the like. The surface mounting components 128 and 129 may be encapsulated by the second encapsulant 199, which may be the material described above, such as the EMC.

A process of manufacturing the electronic component package 100D, according to another example, is the same as the process of manufacturing the electronic component package 100A described above except that the components described above are formed adjacently to the active surface and the inactive surface of the electronic component 120. Therefore, a description for the process of manufacturing the electronic component package 100D according to another example will be omitted.

As set forth above, according to the exemplary embodiments in the present disclosure, a package technology capable of effectively radiating heat generated by the electronic component may be provided.

In the present disclosure, a word "connected" is a concept including a case in which any component is indirectly connected to another component by an adhesive layer, or the like, as well as a case in which any component is directly connected to another component. In addition, a word "electrically connected" is a concept including both of a case in which any component is physically connected to another component and a case in which any component is not physically connected to another component.

A term "example" used in the present disclosure does not mean the same exemplary embodiment, but is provided in order to emphasize and describe different unique features. However, the above suggested examples may also be implemented to be combined with a feature of another example. For example, even though particulars described in a specific example are not described in another example, it may be understood as a description related to another example unless described otherwise.

As a non-exhaustive example only, electronic device 1000 as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device configured to perform wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

A computing system or a computer may include a microprocessor that is electrically connected to a bus, a user interface, and a memory controller, and may further include a flash memory device. The flash memory device may store N-bit data via the memory controller. The N-bit data may be data that has been processed and/or is to be processed by the microprocessor, and N may be an integer equal to or greater than 1. If the computing system or computer is a mobile device, a battery may be provided to supply power to operate the computing system or computer. It will be apparent after an understanding of the disclosure of this application that the computing system or computer may further include an application chipset, a camera image processor, a mobile Dynamic Random Access Memory (DRAM), or any other component suitable for inclusion in a computing system or computer. The memory controller and the flash memory device may constitute a solid-state drive or disk (SSD) that uses non-volatile memory to store data.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component package, comprising:
   a frame having a through hole, and comprising a first wiring layer disposed on a first surface of the frame;
   an electronic component having an active surface on which electrode pads are disposed and an inactive surface opposing the active surface, the electronic component disposed in the through hole;
   an encapsulant covering the inactive surface of the electronic component and a portion of the first wiring layer, and disposed between the frame and the electronic component within the through hole;
   a metal layer disposed to abut a top surface of the encapsulant; and
   a redistribution layer disposed adjacently to the active surface of the electronic component and electrically connected to the electrode pads,
   wherein the frame further comprises:
      a second wiring layer disposed on an inner wall of the frame, and
      the metal layer directly contacts at least a portion of the first wiring layer and at least a portion of the second wiring layer, and
      the metal layer and the first and second wiring layers contacting the metal layer serve as a ground of the electronic component package.

2. The electronic component package of claim 1, wherein a surface of the first wiring layer is coplanar with a surface of the encapsulant.

3. The electronic component package of claim 1, wherein the frame further comprises:
   a through-wiring penetrating through the frame; and
   a third wiring layer disposed on a second surface of the frame.

4. The electronic component package of claim 1, further comprising:
   a passivation layer disposed on the metal layer and having openings; and
   a heat sink disposed on the passivation layer and connected to the metal layer through the openings.

5. The electronic component package of claim 4, further comprising:
   a second passivation layer disposed on the redistribution layer and having second openings; and
   second connection terminals disposed in the second openings,
   wherein at least one of the second connection terminals is disposed in a fan-out region.

6. The electronic component package of claim 1, further comprising:
   a passivation layer disposed on the metal layer and having openings; and
   connection terminals disposed in the openings,
   wherein at least one of the connection terminals is disposed in a fan-out region, and
   a connection terminal connected to the metal layer is a connection terminal for connecting the electronic component to a ground.

7. An electronic component package, comprising:
   a frame having a through hole, and comprising a first wiring layer disposed on a first surface of the frame;
   an electronic component having an active surface on which electrode pads are disposed and an inactive surface opposing the active surface, the electronic component disposed in the through hole;
an encapsulant covering the inactive surface of the electronic component and a portion of the first wiring layer, and disposed between the frame and the electronic component within the through hole;
a metal layer disposed to abut a top surface of the encapsulant;
a redistribution layer disposed adjacently to the active surface of the electronic component and electrically connected to the electrode pads;
a passivation layer disposed on the metal layer and having openings; and
a memory chip package disposed on the passivation layer and connected to the metal layer through connection terminals disposed in the openings,
wherein the connection terminals connected to the metal layer are connection terminals for connecting a ground of the electronic component to a ground of the memory chip package.

8. The electronic component package of claim 7, wherein the memory chip package comprises:
a substrate;
a memory chip disposed on the substrate; and
a wire electrically connecting the substrate and the memory chip to each other; and
a second encapsulant encapsulating the memory chip.

9. The electronic component package of claim 7, further comprising:
a second passivation layer disposed on the redistribution layer and having second openings; and
second connection terminals disposed in the second openings,
wherein at least one of the second connection terminals is disposed in a fan-out region.

10. An electronic package, comprising:
a frame having a through hole, and comprising a first wiring layer disposed on a first surface of the frame;
an electronic component having an active surface on which electrode pads are disposed and an inactive surface opposing the active surface, the electronic component disposed in the through hole;
an encapsulant covering the inactive surface of the electronic component and a portion of the first wiring layer, and disposed between the frame and the electronic component within the through hole;
a metal layer disposed to abut a top surface of the encapsulant;
a redistribution layer disposed adjacently to the active surface of the electronic component and electrically connected to the electrode pads;
a passivation layer disposed on the metal layer and having openings;
connection terminals disposed in the openings;
a second passivation layer disposed on the redistribution layer;
a surface mounting component disposed on the second passivation layer and electrically connected to the electrode pads of the electronic component through the redistribution layer; and
a second encapsulant disposed on the second passivation layer and encapsulating the surface mounting component,
wherein at least one of the connection terminals is disposed in a fan-out region, and
a connection terminal connected to the metal layer is a connection terminal for connecting the electronic component to a ground.

11. An electronic component package, comprising:
a frame having a through hole, and comprising a first wiring layer disposed on a first surface of the frame;
an electronic component having a first surface and an opposing second surface, the electronic component being disposed in the through hole;
an encapsulant disposed over the first surface of the electronic component, a portion of the first wiring layer, and into the gap between sidewalls of the through hole and the electronic component;
a metal layer disposed to abut a top surface of the encapsulant to electrically connect with ground terminals; and
electrode pads electrically connected to a redistribution layer being disposed on the opposing second surface of the electronic component,
wherein the frame further comprises:
a second wiring layer disposed on an inner wall of the frame, and
the metal layer directly contacts at least a portion of the first wiring layer and at least a portion of the second wiring layer, and
the metal layer and the first and second wiring layers contacting the metal layer serve a ground of the electronic component package.

12. The electronic component package of claim 11, wherein the first surface of the electronic component is an inactive surface and the opposing second surface the active surface.

13. The electronic component package of claim 12, wherein the frame is used to structurally support the electronic component package.

14. The electronic component package of claim 13, wherein an electronic device comprises the electronic component package.

* * * * *